US007109721B2

(12) United States Patent
Maurer et al.

(10) Patent No.: US 7,109,721 B2
(45) Date of Patent: Sep. 19, 2006

(54) METHOD AND ELECTRONIC CIRCUIT FOR REGENERATING AN ELECTRICAL CONTACT

(75) Inventors: Helmut Maurer, Vaihingen (DE); Eberhard Schnaibel, Hemmingen (DE); Lothar Raff, Remseck (DE); Oliver Hoerrmann, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 74 days.

(21) Appl. No.: 10/888,295

(22) Filed: Jul. 9, 2004

(65) Prior Publication Data

US 2005/0029096 A1 Feb. 10, 2005

(30) Foreign Application Priority Data

Jul. 10, 2003 (DE) ................................ 103 31 158

(51) Int. Cl.
*G01R 31/327* (2006.01)
*H01H 1/60* (2006.01)

(52) U.S. Cl. ....................................... 324/421; 307/137

(58) Field of Classification Search ................ 324/421, 324/697, 710, 722
See application file for complete search history.

(56) References Cited

U.S. PATENT DOCUMENTS

| | | | | |
|---|---|---|---|---|
| 3,417,323 | A * | 12/1968 | Williamson | 324/421 |
| 3,794,850 | A * | 2/1974 | Hirose | 307/137 |
| 3,996,514 | A * | 12/1976 | Brown et al. | 324/722 |
| 4,173,735 | A * | 11/1979 | Merchant | 324/421 |
| 4,178,543 | A * | 12/1979 | Wrinn et al. | 324/718 |
| 4,491,797 | A * | 1/1985 | Velsher | 324/421 |
| 5,091,698 | A * | 2/1992 | Grabs | 324/693 |
| 5,258,654 | A * | 11/1993 | Roberts et al. | 307/125 |
| 2004/0130331 | A1* | 7/2004 | Frederick et al. | 324/555 |

* cited by examiner

*Primary Examiner*—Anjan Deb
(74) *Attorney, Agent, or Firm*—Kenyon & Kenyon LLP

(57) ABSTRACT

A method and an electronic circuit for regenerating an electrical contact are provided in order to remedy the problem of electrical contacts becoming highly resistive over time. Electrical contacts become highly resistive over time, particularly when the contacts are thermally highly stressed and/or exposed to corrosive gases. To remedy this undesired effect and to reestablish the low resistance of the contacts, an electrical regenerating signal is applied to these contacts.

9 Claims, 3 Drawing Sheets

METHOD AND ELECTRONIC CIRCUIT FOR REGENERATING AN ELECTRICAL CONTACT

FIELD OF THE INVENTION

The present invention relates to a method and an electronic circuit for regenerating at least one electrical contact.

BACKGROUND INFORMATION

It is known from the related art that thermally highly stressed electrical contacts, particularly if they are additionally exposed to corrosive gases, are prone to oxidation or corrosion. The occurrence of oxidation or corrosion has the disadvantage that the affected electrical contacts lose their originally good conductivity and become highly resistive over time, which is undesirable. The same unwanted effect, for example, is also observed as a result of Braun deposits and/or other deposits on the contacts, or as a result of external inputs into the contacts during the production process.

In view of the above drawbacks, it is an object of the present invention to provide a method and an electronic circuit for regenerating a highly resistive electrical contact.

SUMMARY OF THE INVENTION

The above object is achieved by the present invention in that an electrical regenerating signal is applied to the contact if the impedance of the contact is highly resistive, or of low resistance. In the case where the impedance of the contact is highly resistive, the electrical regenerating signal has the advantageous effect of removing the corrosion and/or the deposit on the contact. Put more precisely, oxidation barrier layers, for example, produced by corrosive gases, or contaminants in the contact, which cause the high resistance of the contact, are removed by the electrical regenerating signal. The same applies to temporary blockages of electrode contacts, or deposits on the surfaces of a contact caused by external input, or by processing residues.

Even in the case where the impedance of the contact is of a low resistance, it may be advantageous to apply the regenerating signal to the contact, thereby achieving a preventive protection against the occurrence of high resistance.

The remedial effect of the electrical regenerating signal is especially effective when the regenerating signal takes the form of an electrical pulse sequence, in which case the regenerating signal may be referred to as "therapeutic pulses." Exemplary embodiments of the pulse sequence are described below in further detail.

A further exemplary embodiment of the method according to the present invention provides for the electrical regenerating signal to act on the highly resistive contact not permanently, but only temporarily, that is, only at a defined point in time or during a predetermined temporal interval. Once the remedial effect of the regenerating signal has set in and the contact has been transformed from a highly resistive state back to a state of low resistance, the regenerating signal can be switched off. Alternatively, the regenerating signal may continue to be applied to the contact even after the onset of the low resistance state, thereby preventing a recurring emergence of high resistance of the contact in this manner.

The present invention also provides an electronic circuit for regenerating an electrical contact. According to the present invention, this electronic circuit includes a monitoring device for monitoring the electrical impedance of the electrical contact, and a signal generator for generating and outputting a regenerating signal to the electrical contact in response to a first control signal output by the monitoring device if the electrical impedance of the contact is highly resistive or of a low resistance.

Furthermore, for regenerating an electrical contact within a lambda probe, an advantageous exemplary embodiment of the electronic circuit according to the present invention utilizes a circuit for measuring the internal resistance of the lambda probe. In contrast to the related art, however, this circuit according to the present invention may be operated only when the contact to be regenerated within the lambda probe is highly resistive.

DETAILED DESCRIPTION

Figure 1:
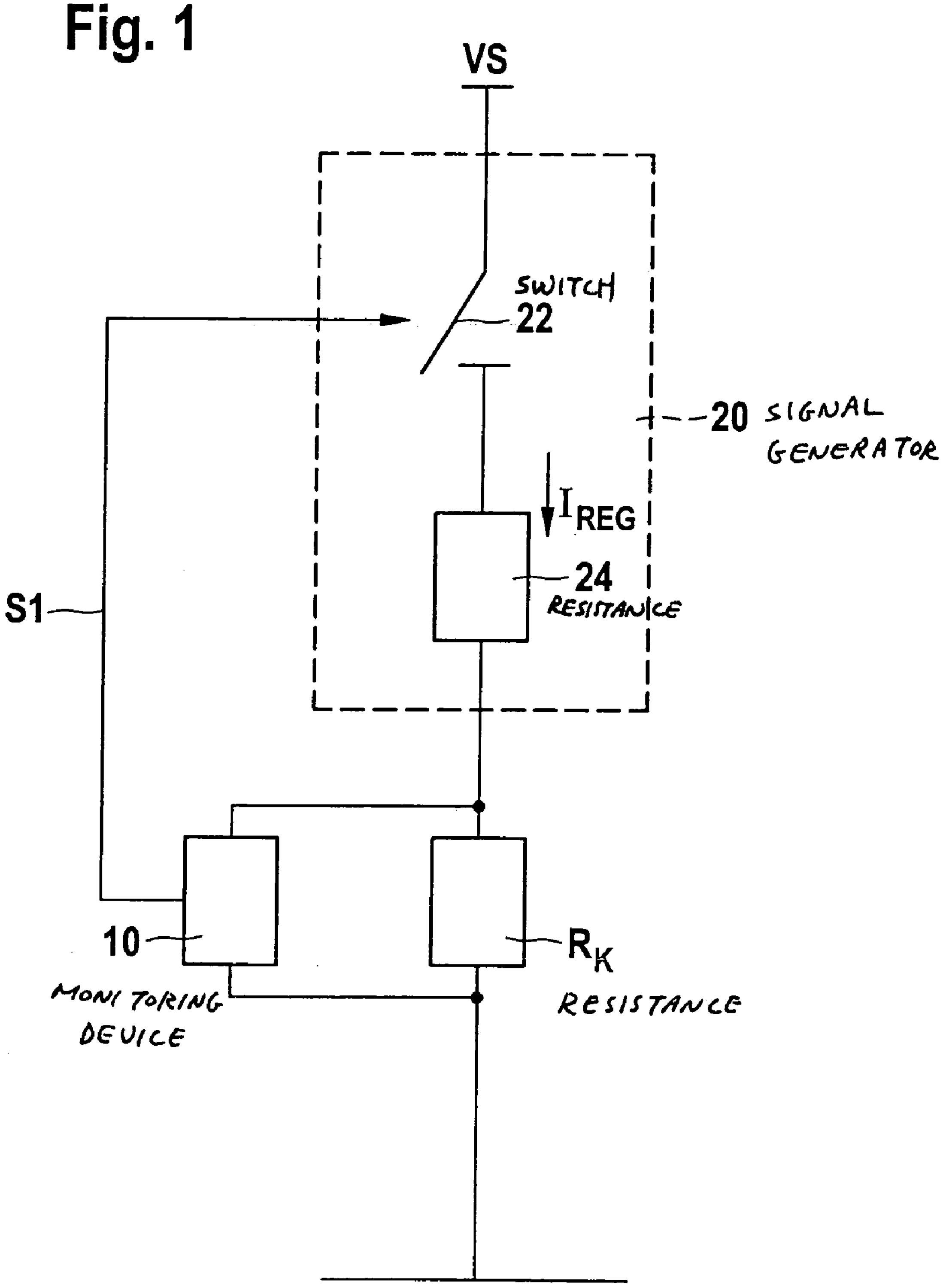
FIG. 1 shows a first exemplary embodiment of a circuit according to the present invention.

FIG. 1 shows a first exemplary embodiment of the circuit according to the present invention. The circuit includes an electrical contact, which is symbolized in FIG. 1 by its impedance $R_K$, also referred to below simply as resistance. The electrical contact is error-free when it has a good conductivity, which is ideally provided when the resistance value is zero ohm.

According to the present invention, the value of this resistance $R_K$ is monitored with the aid of a monitoring device 10. If this monitoring device 10 detects that the value of the resistance $R_K$ of the electrical contact exceeds a specified first resistance threshold value, because, for example, in an undesired manner the contact became highly resistive due to contaminants introduced, then monitoring device 10 produces a first control signal S1 for triggering a signal generator 20 of the electronic circuit.

In FIG. 1, this signal generator 20 takes the form of a current source. Signal generator 20 is made up of a series circuit, i.e., an electrical switching element 22 having an electrical resistance 24. One end of this series circuit is connected to a supply voltage VS, while the other end of this series circuit is connected to the hot end, that is, the end of the contact to be regenerated that is not connected to ground. Current source 20 activated by first control signal S1 produces as regenerating signal a regenerating current $I_{Reg}$ to be output to the electrical contact. The electrical regenerating signal is especially effective at removing the high resistance of the electrical contact if the signal takes the form of a pulse sequence, for example. In this case, the amplitudes of the individual pulses may be all positive, all negative, or alternate between positive and negative.

A regenerating signal $I_{Reg}$ of this form has the advantageous effect that the blockages or insulating layers within the contact that cause the high resistance are removed, and hence the contact regains its low resistance. As soon as the contact has regained its low resistance, the regenerating signal can be switched off. To this extent, the regenerating signal need only be applied temporarily to the contact.

Figure 2:
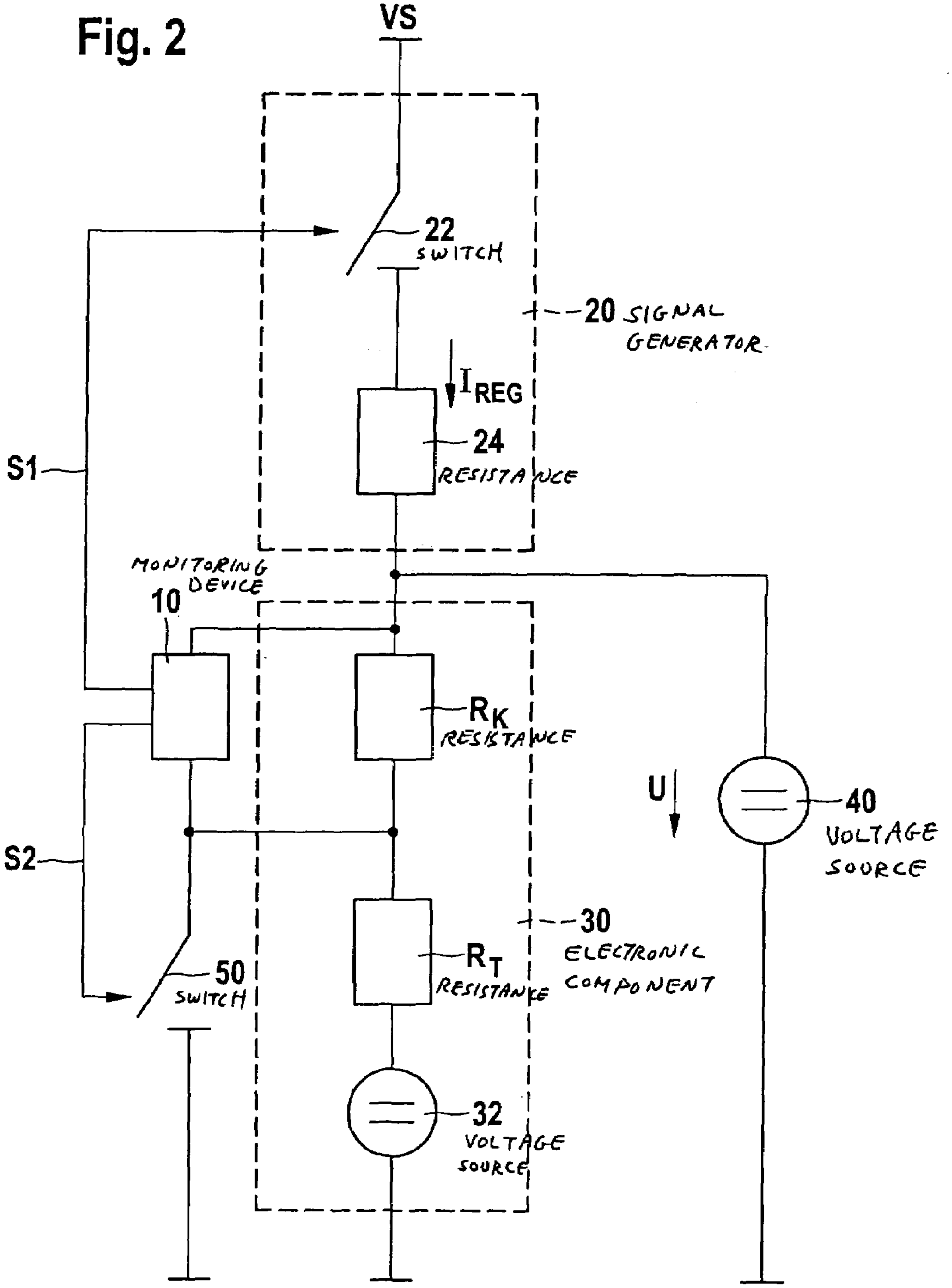
FIG. 2 shows a second exemplary embodiment of the circuit according to the present invention.

FIG. 2 shows a second exemplary embodiment of the circuit according to the present invention. In FIG. 2, the electrical contact, again represented by its resistance $R_K$, is shown as part of an electronic component 30. Component 30, for example, can be a cable harness or a sensor or probe device such as, for example, a lambda probe, a phase detector or a knock sensor. The contact in these components that is to be regenerated according to the present invention could be, for example, a compressive contact, a pin weld, the slider tap of a potentiometer, a crimp, etc. FIG. 2 also shows that this component 30 is operated at a voltage source 40 that generates a voltage U.

In FIG. 2, the electronic component 30 represents, e.g., a lambda probe. In addition to the electrical contact $R_K$, this component is further represented by a temperature-dependent resistance $R_T$ and a voltage source 32. In the circuit shown in FIG. 2, the application of the regenerating signal $I_{Reg}$ to the contact occurs in exactly the same way as was described above with reference to FIG. 1. At the beginning of the regenerating phase, when the resistance $R_K$ is still very high, only a relatively small regenerating current $I_{Reg}$ flows across the resistance, and thus through the other elements of electronic component 30, e.g., through temperature-dependent resistance $R_T$ or voltage source 32. In the course of the regenerating phase, however, the resistance value of the resistance $R_K$ is progressively lowered, and in conjunction, the amplitude of the regenerating signal rises as well. Thus, there is the danger that the other elements of the electronic component, or generally other components of the circuit, are electronically overloaded by the regenerating signal.

To prevent this, monitoring device 10 is further designed to generate a second control signal S2 and to output this, for example, to a second switching device 50. In response to second control signal 52, if the value of resistance $R_K$ of the contact has fallen below a specified second resistance threshold value, switching device 50 short-circuits at least individual elements of electronic component 30 (except for the contact itself), and/or additional electronic components of the circuit. This short-circuiting to ground achieves the result that regenerating signal $I_{Reg}$ is not discharged via the short-circuited elements or components, but via the short circuit to ground, thus preventing the regenerating signal from possibly destroying these elements of component 30. As an alternative to such a protective measure, in individual cases it may be sufficient to limit the amplitude of the regenerating signal from the outset to be so small that the regenerating signal would not destroy the affected individual elements or components of the circuit. Even a regenerating signal weakened in this manner can bring about the desired remedial effect in the electrical contact.

Generally, the regenerating signal may be fed to the contact to be regenerated via supply lines, as well as via signal lines within the electronic circuit.

Figure 3:
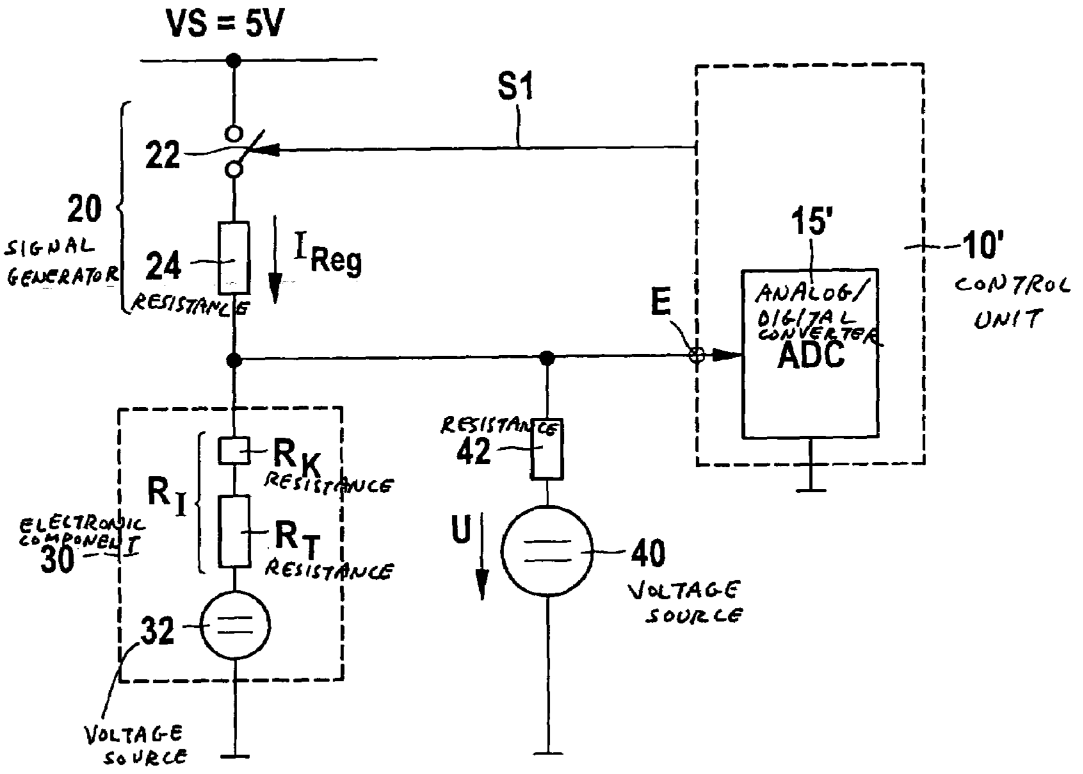
FIG. 3 shows a third exemplary embodiment of the circuit according to the present invention.

FIG. 3 shows another exemplary embodiment of the electronic circuit according to the present invention. The circuit shown in FIG. 3 largely corresponds to the structure already mentioned in FIG. 2, with identical electronic elements being indicated by the same reference symbols.

The electronic circuit shown in FIG. 3 for ascertaining the internal resistance of electronic component 30 (in this case lambda probe) works as follows. During normal operation, lambda probe 30 is operated via voltage source 40. The internal resistance of voltage source 40 is denoted in FIG. 3 by reference numeral 42. At its input E, control unit 10' receives a signal representing the voltage drop across the internal resistance $R_I$ of the lambda probe and hence in each instance a current lambda value. This signal is normally an analog signal, which is therefore digitalized for further processing or evaluation within control unit 10' with the aid of an analog/digital converter 15'.

The inference typically drawn from this signal to the lambda value measured by lambda probe 30 of, e.g., the exhaust gas of an internal combustion engine rests on the basic principle that the temperature in the exhaust gas of the internal combustion engine can be assessed as the measure for the current air/fuel ratio at which the internal combustion engine is currently operated. Lambda probe 30 therefore contains the temperature-dependent resistance $R_T$ so as to be able to evaluate the voltage drop across this temperature-dependent resistance $R_T$ as the measure for the current lambda value. An operating point of this lambda probe is individually set with the aid of a heater (not shown) of the lambda probe.

A derivation of the correct lambda value based on the voltage drop across the lambda probe is possible only if the heater of the lambda probe is functioning properly and the internal resistance of the lambda probe is correctly ascertainable. Fundamentally, this internal resistance corresponds to the already mentioned temperature-dependent resistance $R_T$. This is particularly relevant when the resistance $R_K$ of the electronic contact in lambda probe 30 is negligibly small.

To check the proper functioning of the probe heater and hence also the proper functioning of the lambda probe, control unit 10' occasionally performs a measurement of the internal resistance RI of lambda probe 30. To this end, control unit 10' activates the signal generator (or current source) 20 by issuing a first control signal S1. In this manner, a regenerating signal is given in the form of a regenerating current $I_{Reg}$, e.g., in the form of a sequence of current pulses across the internal resistance $R_I$ of lambda probe 30. Because the regenerating signal as well as the internal resistance of lambda probe 30 are known, if the lambda probe is intact, it must experience a predictable voltage drop. The actual voltage drop is fed to control unit 10' via its input E in order to be subsequently compared to the expected voltage value. If the agreement is sufficiently high, it can be assumed that the lambda probe and particularly its heater are working error-free. This inference is particularly reliable if the internal resistance $R_I$ is low and the probe is warm or hot.

As can be seen in FIG. 3, in terms of the substitute circuit diagram, the internal resistance $R_I$ is composed of a series circuit of the temperature-dependent resistance $R_T$ and the resistance $R_K$ of the electronic contact. In the case of a cold lambda probe 30 and a highly resistive temperature-dependent resistance $R_T$, a high internal resistance $R_I$ will automatically be measured as well. The measurement of the internal resistance $R_I$ then does not permit a distinction as to whether the high resistance of the internal resistance results from a high resistance of the temperature-dependent resistance $R_T$ or from a high resistance of the resistance $R_K$ of the electronic contact. The internal resistance measurement is therefore performed only in the case of a low internal resistance, that is, when the probe is warm.

A regeneration of the electrical contact within the lambda probe, however, is only necessary if the resistance of this electronic contact $R_K$ is high.

In the electronic circuit shown in FIG. 3, this resistance $R_K$ cannot be measured directly, but only indirectly via internal resistance $R_I$. That is to say, if control unit 10' detects a high internal resistance $R_I$, then this is an indication that resistance $R_K$ may be high as well, since, based on the substitute circuit diagram shown, a high internal resistance $R_I$ can derive from a high temperature-dependent resistance $R_T$ and/or from a high resistance $R_K$.

According to the present invention, therefore, the regenerating signal $I_{Reg}$ produced by current source (signal generator) 20 is, for regenerating purposes, output to lambda probe 30, and particularly to its electrical contact, only when the lambda probe is cold or is not yet at operating temperature, i.e., when its internal resistance $R_I$ (as representative of the resistance of the electronic contact) is highly resistive.

This assumes that the detected high resistance level of the internal resistance is not solely due to the high resistance of the temperature-dependent resistance $R_T$, but also due to an undesired high resistance of the resistance $R_K$ of the electrical contact, which, according to the substitute circuit diagram, is connected in series to $R_T$. Only then is the functionality of the contact indeed significantly impaired, and only then does the contact require regeneration or a remedial measure through the regenerating signal.

Even in the alternative case, i.e., when the high resistance of the internal resistance $R_I$ results primarily from the high resistance of the temperature-dependent resistance $R_T$ alone and the resistance of the electrical contact is low, the application of the regenerating signal to the electrical contact is fundamentally harmless. This is particularly true as long as the regenerating signal is not excessively strong (e.g., in terms of amplitude) so as electrically to overload the other electronic elements within the lambda probe. But even in those cases where the contact has a low resistance, e.g., particularly when the lambda probe is at operating temperature, that is to say, during the operation of the internal combustion engine or shortly after it has been switched off, an application of the regenerating signal to the contact can be advantageous in order to prevent the contact from becoming highly resistive.

As an example, the regenerating signal may be applied to the electrical contact only during times when the useful signal, e.g., in the case of the lambda probe the λ measuring signal, is suppressed.

Figure 4:
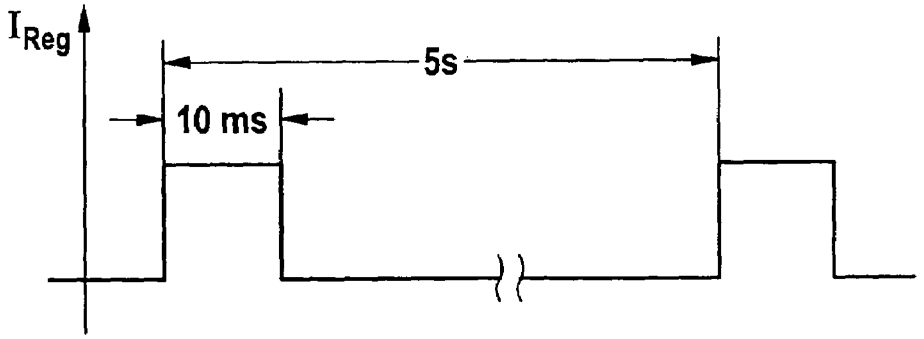
FIG. 4 shows an example of a regenerating signal according to the present invention.

FIG. 4 shows an example of a regenerating signal $I_{Reg}$ tailored for regenerating a contact within a lambda probe. It is formed as a sequence of current pulses, the amplitude of the individual pulses lying in the range of single digit mA, for example, with the pulse repetition frequency being in the range of several tens of Hertz, for example, and the pulse width being within a range of 1 to 10 milliseconds, for example.

What is claimed is:

1. An electronic circuit for regenerating at least one electrical contact, comprising:

a monitoring device for monitoring an electrical impedance of the electrical contact; and a signal generator for providing a regenerating signal to the electrical contact in response to a first control signal output by the monitoring device if the electrical impedance of the electrical contact is highly resistive, wherein:

the signal generator generates a pulse sequence as the regenerating signal, and the electrical contact is situated within an electronic component of the electronic circuit; and a switching device for selectively short circuiting at least one element within the electronic component, except for the electrical contact, in response to a second control signal output by the monitoring device, if the impedance of the electrical contact has fallen below a specified resistance threshold.

2. The electronic circuit as recited in claim 1, wherein the signal generator adjusts at least one of an amplitude of the regenerating signal, a pulse repetition frequency of the regenerating signal, and a pulse width of the regenerating signal, such that elements of the electronic circuit are not electrically overloaded by the regenerating signal.

3. The electronic circuit as recited in claim 2, wherein the electronic component is a lambda probe.

4. The electronic circuit as recited in claim 3, wherein the monitoring device is a control unit for detecting an internal resistance of the lambda probe, and wherein if a high resistance value is ascertained for the internal resistance, the high-resistance value is interpreted as an indication that the impedance of the electrical contact is highly resistive, and wherein the signal generator is a current source triggered by the control unit, the signal generator outputting a sequence of current pulses to the contact in response to the first control signal.

5. An electronic circuit for regenerating at least one electrical contact of an electronic component, comprising:

a monitoring device for monitoring an electrical impedance of the electrical contact;

a signal generator for generating and outputting a regenerating signal to the electrical contact; and a switching device for short circuiting at least one element within the electronic component.

6. The electronic circuit as recited in claim 5, wherein the signal generator generates the regenerating signal as a pulse sequence.

7. The electronic circuit as recited in claim 5, wherein the electronic component includes a lambda probe.

8. The electronic circuit as recited in claim 5, wherein:

the monitoring device includes a control device for detecting an internal resistance of the electronic component, a detected high-resistance value for the internal resistance is interpreted as an indication that the electrical impedance is highly resistive, and the signal generator includes a current source controlled by the control device, the control device outputting a sequence of current pulses to the electrical contact in response to a first control signal.

9. A method for regenerating at least one electrical contact of an electronic component, comprising:

monitoring an electrical impedance of the electrical contact;

generating and outputting a regenerating signal to the electrical contact; and short circuiting at least one element within the electronic component.

* * * * *